(12) United States Patent
Takahashi et al.

(10) Patent No.: US 7,061,094 B2
(45) Date of Patent: Jun. 13, 2006

(54) MULTILAYER PRINTED CIRCUIT BOARD INCLUDING FIRST AND SECOND SIGNAL TRACES AND A FIRST GROUND TRACE

(75) Inventors: Eiji Takahashi, Kashiba (JP); Takeshi Nakayama, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/035,953

(22) Filed: Jan. 18, 2005

(65) Prior Publication Data
US 2005/0156307 A1    Jul. 21, 2005

(30) Foreign Application Priority Data
Jan. 19, 2004  (JP)  ............... 2004-011015

(51) Int. Cl.
   H01L 23/52   (2006.01)
   H01L 23/12   (2006.01)
   H05K 3/46    (2006.01)
   H01P 5/02    (2006.01)

(52) U.S. Cl. .............. 257/691; 257/E29.015; 257/E25.017; 257/E23.013; 257/E21.575; 257/774; 257/773; 257/680; 257/668; 257/698; 257/700; 257/701; 257/758

(58) Field of Classification Search ........ 257/E29.015, 257/E25.017, E23.013, E21.575, 691, 774, 257/773, 758, 680, 668, 690, 698, 784, 786, 257/700, 701; 361/748, 749; 324/252, 260; 428/209, 901, 456
See application file for complete search history.

(56) References Cited

U.S. PATENT DOCUMENTS

| | | | | |
|---|---|---|---|---|
| 3,414,848 A | * | 12/1968 | Morrow et al. | 333/238 |
| 3,855,542 A | * | 12/1974 | Grace | 330/287 |
| 4,245,356 A | * | 1/1981 | Hallford | 455/327 |
| H1306 H | * | 5/1994 | Drach | 228/262.2 |
| 5,348,792 A | * | 9/1994 | Hattori et al. | 428/209 |
| 5,410,323 A | * | 4/1995 | Kuroda | 343/700 MS |
| 5,532,659 A | * | 7/1996 | Dodart | 333/260 |
| 5,628,031 A | * | 5/1997 | Kikinis et al. | 710/73 |
| 6,856,131 B1 | * | 2/2005 | Miyazawa et al. | 324/252 |
| 2002/0141168 A1 | * | 10/2002 | Tsukahara | 361/768 |

FOREIGN PATENT DOCUMENTS

| | | | |
|---|---|---|---|
| JP | 7-321463 | * | 12/1995 |
| JP | 11-298150 | | 10/1999 |
| JP | 2000-323905 | * | 11/2000 |
| JP | 2004-64174 | * | 2/2004 |

* cited by examiner

Primary Examiner—Alexander Ocar Williams
(74) Attorney, Agent, or Firm—Wenderoth, Lind & Ponack, L.L.P.

(57) ABSTRACT

A multilayer printed circuit board (PCB) includes a substrate; a ground layer having edges which define a gap portion, the ground layer being provided on a bottom face of the substrate; and at least two signal traces and provided on a top face of the substrate so as to straddle the gap portion and so as to be substantially parallel to each other. The multilayer PCB also includes at least one ground trace provided between the at least two signal traces and on the top face of the substrate so as to straddle the gap portion.

11 Claims, 6 Drawing Sheets

MULTILAYER PRINTED CIRCUIT BOARD INCLUDING FIRST AND SECOND SIGNAL TRACES AND A FIRST GROUND TRACE

BACKGROUND OF THE INVENTION

1. Field of the Invention

The present invention relates to a multilayer printed circuit board (PCB), and more particularly to a multilayer PCB consisting of two or more layers with a plurality of signal traces or power traces.

2. Description of the Background Art

A typical multilayer PCB has a ground layer which is normally formed vertically beneath a substrate so as to be substantially parallel to a signal trace and/or a power trace on the substrate. In some typical multilayer PCBs, the ground layer has edges which define a gap portion formed for reasons of the design of a print pattern and/or for convenience of mounting. In such a case, the signal trace or the power trace straddles the gap portion in the ground layer. If a current is applied to a load connected to such a multilayer PCB, a return current flowing through the ground layer detours around the gap portion, so that a current loop area is increased, resulting in an increase of unwanted emission.

Conventionally, there is a multilayer PCB (hereinafter, referred to as a "conventional multilayer PCB") in which a ground trace is formed next to a signal trace or a power trace in order to curb the occurrence of the unwanted emission.

FIGS. 6A and 6B are schematic views showing the structure of the conventional multilayer PCB. For convenience of explanation, X-, Y-, and Z-axes perpendicular to each other are shown in FIGS. 6A and 6B. Specifically, FIG. 6A is a top view showing the structure of the conventional multilayer PCB, and FIG. 6B is a view showing a cross section of the multilayer PCB viewed from the direction of arrow B and taken along plane A shown in FIG. 6A (see one-dot chain line) which is parallel to the ZX-plane.

In FIGS. 6A and 6B, the conventional multilayer PCB includes a substrate 101, a ground layer 102, a signal trace 103, two vias 104a and 104b, and a ground trace 105. For convenience of illustration, the substrate 101 is not shown in FIG. 6A.

The substrate 101 is composed of a dielectric material.

The ground layer 102 is composed of a low impedance material, and formed on the bottom face of the substrate 101. The ground layer 102 is not formed across the entire bottom face of the substrate 101, and is in the shape of, for example, a square "U" when viewed from vertically above. As shown in FIG. 6A, the ground layer 102 has edges which define a gap portion α formed for reasons of the design of a print pattern and/or for convenience of mounting. Specifically, the shape of the gap portion α is defined by inner edges of the ground layer 102 (see FIG. 6A) as a rectangle which ranges from a left end portion of the ground layer 102 to the vicinity of the center in a direction parallel to the X-axis.

The signal trace 103 is composed of a conductive material, and formed on the top face of the substrate 101 in a direction parallel to the Y-axis. Here, if the signal trace 103 is projected vertically down onto the ground layer 102, the projected signal trace 103 crosses the gap portion α. The signal trace 103 is formed on the top face of the substrate 101 which satisfies the above condition. That is, the signal trace 103 is situated so as to straddle the gap portion α.

The vias 104a and 104b are formed in the following manner. Firstly, two through holes each having an axis parallel to the Z-axis are formed in the substrate 101. Here, each through hole is located in the vicinity of an edge of the ground layer 102 at a predetermined distance away from the signal trace 103 in the X-axis direction (in this instance, the negative direction of the X-axis). Cylindrical surfaces of such through holes are coated with a conductive material to complete the vias 104a and 104b.

The ground trace 105 is composed of a conductive material, and formed on the top face of the substrate 101 in a direction parallel to the Y-axis. The ground trace 105 connects the vias 104a and 104b at their top ends.

If a current is applied to a load (not shown) connected to the above-described signal trace 103 and ground layer 102 (see arrow C in FIG. 6A), as indicated by arrow D in FIG. 6A, a return current flows from the ground layer 102 through the via 104a to the ground trace 105 substantially without detouring around the gap portion α, and returns to the ground layer 102 through the via 104b. Thus, it is possible to reduce the current loop area when compared to the case where the return current detours around the gap portion α. In this manner, the conventional multilayer PCB curbs the occurrence of unwanted emission.

Incidentally, the multilayer PCB is generally costly, and therefore, it is often desired to configure circuitry using a printed circuit board with a smaller number of layers (e.g., a double sided PCB). In the conventional multilayer PCB, however, one or two pieces of ground traces 105 are formed for each piece of signal trace 103. If one piece of signal trace 103 occupies one or two ground traces 105, it is difficult to form a number of signal traces on the multilayer PCB. Because this results in the formation of a large number of ground traces 105 on the multilayer PCB, a large area of the top face of the substrate 101 is occupied by the ground traces 105. Thus, the area that is occupied by various traces on the substrate 101 (i.e., the trace area) is considerably increased, causing a difficulty in configuring required circuitry using a printed circuit board with a smaller number of layers.

SUMMARY OF THE INVENTION

Therefore, an object of the present invention is to provide a multilayer PCB in which an increase of the trace area is minimized and required circuitry can be configured with a smaller number of layers.

The present invention has the following features to attain the object mentioned above. An aspect of the present invention is directed to a multilayer PCB which includes: a substrate; a ground layer having edges which define a gap portion, the ground layer being provided on a bottom face of the substrate; a first signal trace and a second signal trace provided on a top face of the substrate so as to straddle the gap portion and so as to be substantially parallel to each other; and a first ground trace provided between the first and second signal traces on the top face of the substrate so as to straddle the gap portion.

Preferably, the multilayer PCB further includes a plurality of vias formed on the substrate so as to connect each of two ends of the first ground trace to the ground layer.

Specifically, the multilayer PCB further includes: a third signal trace provided on the top face of the substrate so as to straddle the gap portion, the third signal trace being substantially parallel to the first or second signal trace at a predetermined distance therefrom on a side of the first or second signal trace away from the first ground trace; and a second ground trace provided on the top face of the substrate so as to straddle the gap portion, the second ground trace being substantially parallel to the third signal trace at a predetermined distance therefrom on a side of the third signal trace away from the first ground trace.

Here, preferably, the multilayer PCB further includes a plurality of vias formed on the substrate so as to connect each of two ends of the second ground trace to the ground layer.

More preferably, the multilayer PCB further includes a fourth signal trace provided on the top face of the substrate so as to straddle the gap portion, the fourth signal trace being substantially parallel to the third signal trace at a predetermined distance from the second ground trace on a side of the second ground trace away from the third ground trace.

Specifically, the multilayer PCB further includes: at a fifth signal trace formed within the gap portion on the bottom face of the substrate; and a plurality of sixth signal traces formed on the top face of the substrate, the sixth signal traces being electrically connected to the fifth signal trace.

Here, preferably, the multilayer PCB further includes: a plurality of vias formed on the substrate so as to connect each of two ends of the fifth signal trace to any one end of each of the plurality of sixth signal traces.

Also, in the multilayer PCB, the gap includes a first gap part of a first width and a second gap part of a second width, the first and second widths being different; the first signal trace straddles the first gap part and the second signal trace straddles the second gap part; the first ground trace straddles the gap portion more than once, and a number of the plurality of vias is equal to a value obtained by adding 1 to a number of times the first ground trace straddles the gap portion.

Typically, the gap portion is a cut or a slit.

Also, the multilayer PCB is applied to a digital circuit.

Also, in the above aspect, if a current is applied to a load connected to the first or second signal trace and a load connected to the ground layer, part or all of a return current flows from the ground layer to the first ground trace, which is provided on the top face of the substrate, substantially without detouring around the gap portion, and returns to the ground layer.

In the above aspect, a single ground trace is shared by two signal traces. Therefore, it is only required to form roughly half the number of ground traces as required in the conventional art. Accordingly, the degree of occupation of the multilayer PCB by the ground traces is significantly reduced when compared to the conventional art. Thus, it is possible to provide a number of circuits on the multilayer PCB, whereby it is made possible to provide a multilayer PCB in which required circuitry can be configured with a smaller number of layers.

Also, in a preferred embodiment, the ground traces and the ground layer are connected by a plurality of vias. In general, each via occupies a considerable area on the multilayer PCB. However, according to the above aspect, it is possible to minimize the number of ground traces, and therefore, the number of vias can be minimized naturally. Thus, space in which required circuits can be placed is increased on the multilayer PCB, and therefore, it is possible to provide a multilayer PCB in which required circuitry can be configured with a smaller number of layers.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1A:
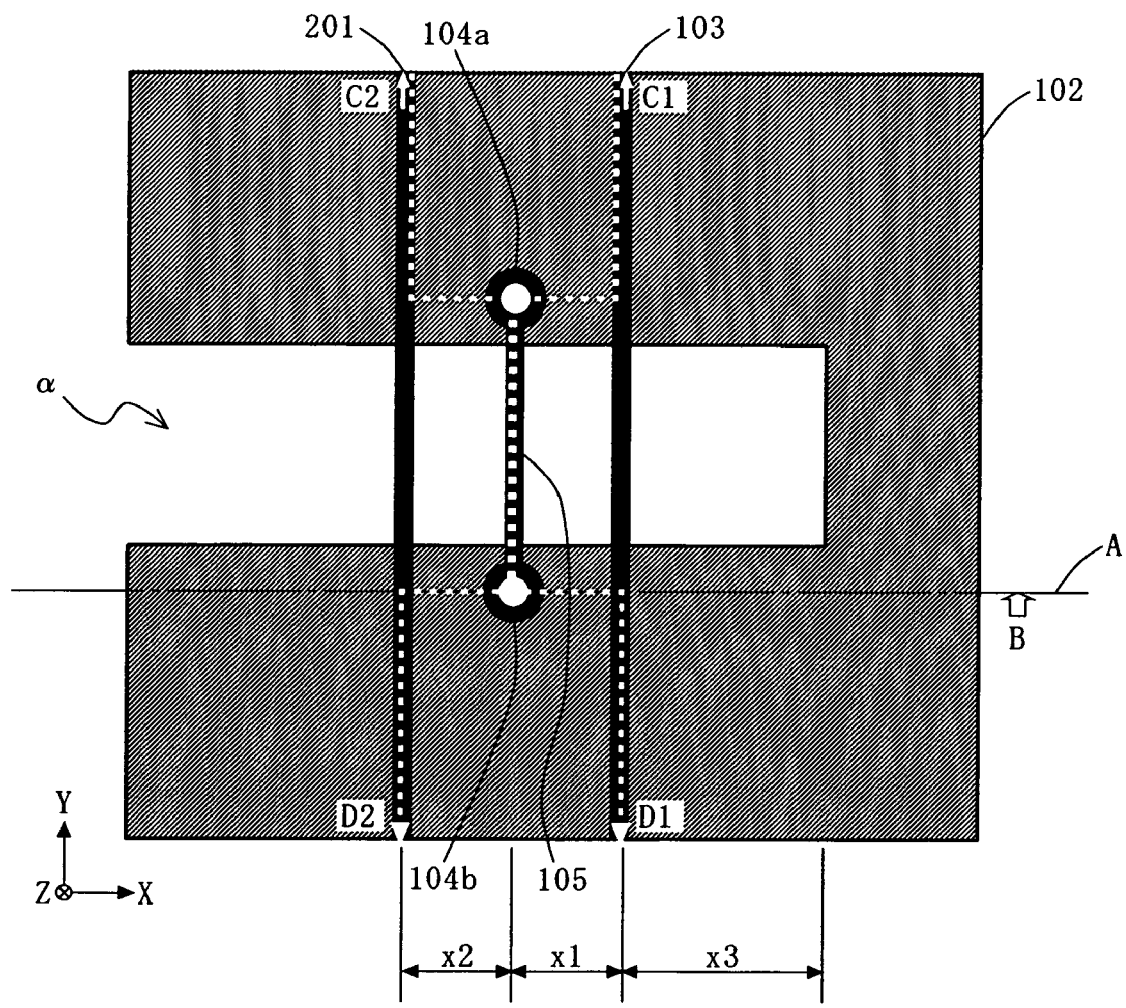
FIG. 1A is a top view showing a structure of a multilayer PCB according to a first embodiment of the present invention.
Figure 1B:
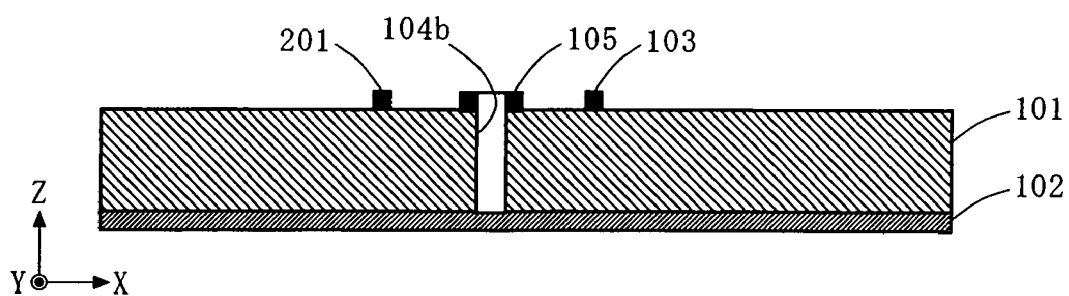
FIG. 1B is a cross-sectional view of the multilayer PCB taken along plane A shown in FIG. 1A.

FIGS. 1A and 1B are schematic views showing the structure of a multilayer PCB according to a first embodiment of the present invention. For convenience of explanation, X-, Y-, and Z-axes perpendicular to each other are shown in FIGS. 1A and 1B. Specifically, FIG. 1A is a top view of the multilayer PCB, and FIG. 1B is a view showing a cross section of the multilayer PCB viewed from the direction of arrow B and taken along plane A shown in FIG. 1A (see one-dot chain line) which is parallel to the ZX-plane.

Figure 6A:
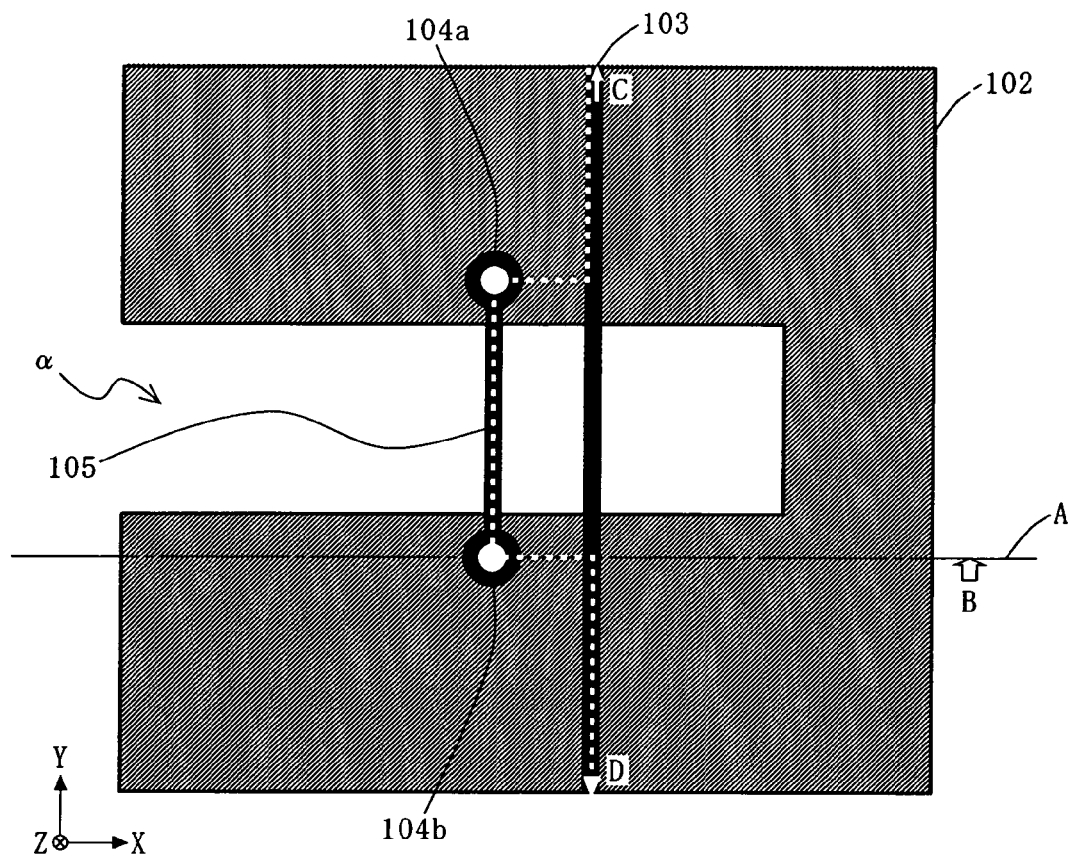
FIG. 6A is a top view showing the structure of a conventional multilayer PCB.
Figure 6B:
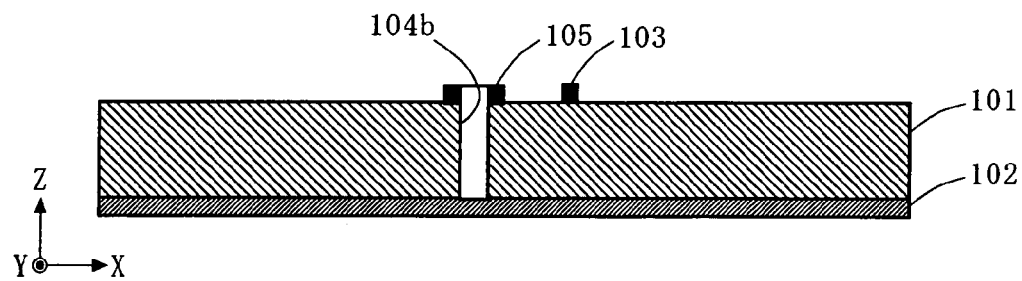
FIG. 6B is a cross-sectional view of the multilayer PCB taken along plane A shown in FIG. 6A.

For example, the multilayer PCB shown in FIGS. 1A and 1B is used as a digital circuit board, such as a motherboard installed in a low-cost personal computer or a circuit board installed in a low-cost set-top box. The multilayer PCB shown in FIGS. 1A and 1B differs from the conventional multilayer PCB (see FIGS. 6A and 6B) in that a signal trace 201 is further provided. Since there is no other difference between the multilayer PCBs, elements shown in FIGS. 1A and 1B corresponding to those shown in FIGS. 6A and 6B are denoted by the same reference numerals, and the descriptions thereof are omitted herein.

Similar to the signal trace 103, the signal trace 201 is composed of a conductive material, and formed on the top face of the substrate 101 in a direction parallel to the Y-axis. Also, the signal trace 201 is located away from the ground trace 105 by a predetermined distance in the X-axis direction (in this instance, the negative direction of the X-axis). Here, if the signal trace 201 is projected vertically down onto the ground layer 102, the projected signal trace 201 crosses the gap portion α. In the present embodiment, a cut is shown as an exemplary portion α in FIGS. 1A and 1B. The signal trace 201 is formed on the top face of the substrate 101 which satisfies the above positional condition. That is, similar to the signal trace 103, the signal trace 201 is situated so as to straddle the gap portion α. As is apparent from the above, the signal traces 103 and 201 are located so as to have the ground trace 105 therebetween such that they are symmetrical to each other with respect to the ground trace 105.

In the above structure, if a current is applied to both a load (not shown) connected to the signal trace 103 and/or the signal trace 201 and a load (not shown) connected to the ground layer 102 (see arrow C1 and/or arrow C2 in FIG. 1A), part or all of a return current flows from the ground layer 102 through the via 104a to the ground trace 105 substantially without detouring around the gap portion α, and as indicated by arrow D1 and/or D2 in FIG. 1A, the part or all of the return current returns to the ground layer 102 through the via 104b. Thus, it is possible to reduce the current loop area when compared to the case where all the return current detours around the gap portion α. In this manner, the multilayer PCB according to the present embodiment curbs the occurrence of unwanted emission.

In the above aspect, a single ground trace 105 is shared by two signal traces 103 and 201. That is, return currents from both the signal traces 103 and 201 are led to the ground trace 105. Such sharing of the ground trace 105 considerably reduces the area that is occupied by ground traces 105 on the multilayer PCB when compared to the conventional art. Consequently, it is possible top lace a number of circuits on the multilayer PCB. Thus, it is possible to provide a multilayer PCB in which required circuitry can be configured with a smaller number of layers.

Also, the ground trace 105 and the ground layer 102 are connected together by a plurality of vias 104a and 104b. In general, each of the vias 104a and 104b occupies a considerable area on the multilayer PCB. For example, the ground trace 105 has a width of approximately 0.15 mm, while the vias 104a and 104b each have a through hole with a diameter of approximately 0.3 mm, and have an outer diameter of approximately 0.7 mm. In the multilayer PCB according to the present embodiment, however, even if a number of circuits are placed on the substrate, it is possible to minimize the total number of ground traces 105, and therefore to minimize the total number of vias 104a and 104b which occupy a considerable area as described above. Thus, space in which required circuits can be placed is increased on the multilayer PCB, and therefore, it is possible to provide a multilayer PCB in which required circuitry can be configured with a smaller number of layers. Note that if it is attempted to reduce the width of the ground trace 105 or the signal traces 103 and 201, or the size of the vias 104a and 104b, the cost of circuit production is increased, and therefore, the practical usefulness is reduced. From this point of view, it is advantageous that a single ground trace 105 is shared by a plurality of signal traces 103 and 201.

The above technical effects can also be achieved by multilayer PCBs according to second through fifth embodiments which will be described later.

Note that as shown in FIG. 1A, in the case where the distance between the signal trace 103 and the ground trace 105 in the X-axis direction is x1, and the distance between the signal trace 201 and the ground trace 105 in the X-axis direction is x2, it is preferred that x1 and x2 are minimum tolerable values in the process of production. The reason for this is that an increase of the trace area is curbed, and further the current loop area is reduced, whereby it is possible to curb the occurrence of unwanted emission.

Also, as shown in FIG. 1A, in the case where the distance between the signal trace 103 and an edge of the ground layer 102 that is parallel to the Y-axis is x3, it is preferred that x1 is less than x3. The reason for this is that in the case where this condition is not satisfied, the current loop area might be reduced if the return current partially detours around the gap portion α.

Also, the width of the ground trace 105 may or may not be equal to those of the signal traces 103 and 201. Also, it is preferred that the length of the ground trace 105 is longer than the dimension of the gap portion α in the Y-axis direction, and kept as short as possible. This is because it is normally preferred that the return current flows through the ground layer 102.

Also, in a high frequency region, a power layer can be considered to be at the same potential as the ground layer. In the present embodiment, the ground trace 105 is situated between the signal traces 103 and 201, and the ground trace 105 and the ground layer 102 are connected by two vias 104a and 104b. However, the present invention is not limited to this, and technical effects similar to those described above can be achieved even in the case where a power trace is provided between the signal traces 103 and 201, and the power trace and the power layer are electrically connected to each other.

Also, even if the ground layer is devoid of a portion which corresponds to the power trace, the ground trace as described above makes it possible to achieve technical effects similar to those described above.

Also, if the ground layer itself is not provided, it is unable to have the ground trace and the signal traces 103 and 201 bypass a gap portion. Under such an assumption, the ground trace is only provided between the signal traces 103 and 201 in the trace layer.

Also, the gap portion α is not limited to that described above, and may vary in shape in accordance with conditions of designing a print pattern and/or conditions of mounting.

(Second Embodiment)

Figure 2A:
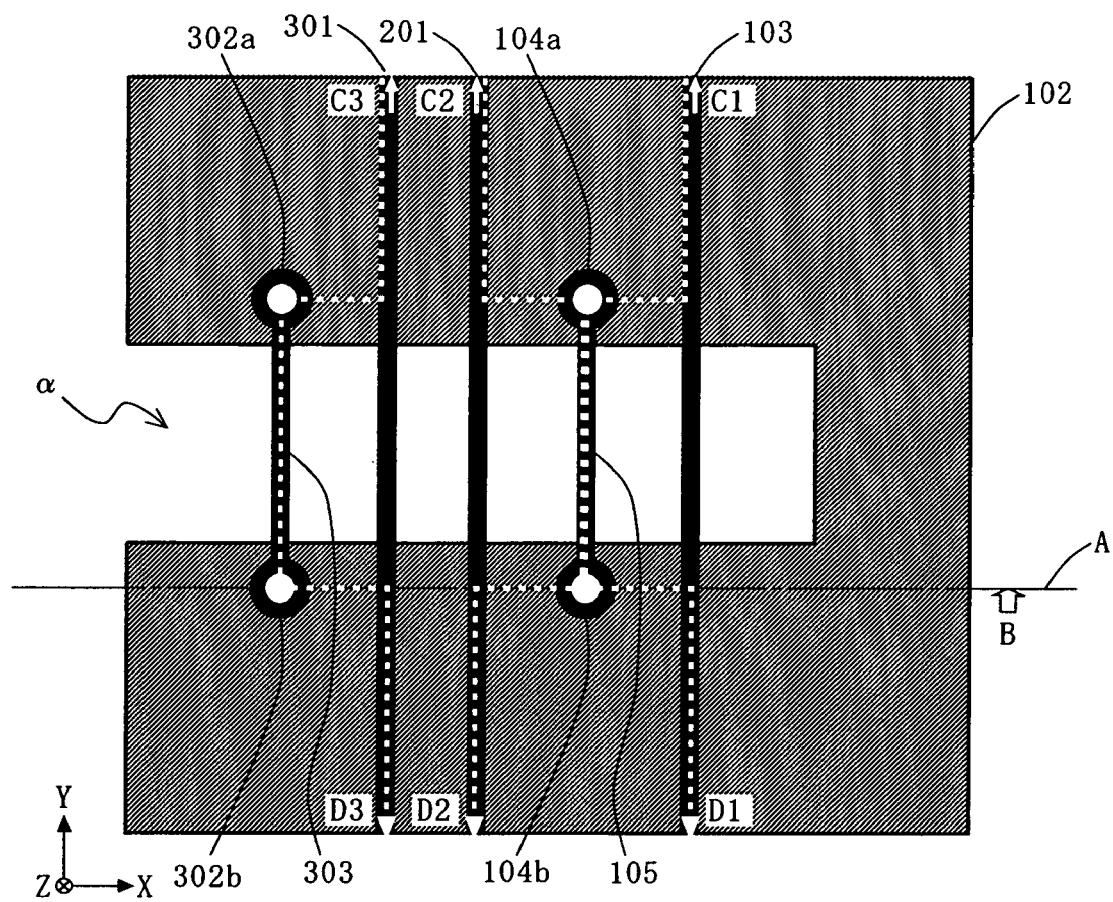
FIG. 2A is a top view showing a structure of a multilayer PCB according to a second embodiment of the present invention.
Figure 2B:
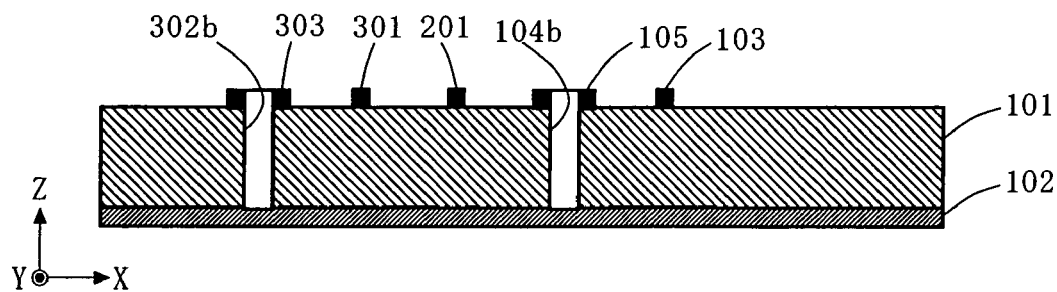
FIG. 2B is a cross-sectional view of the multilayer PCB taken along plane A shown in FIG. 2A.

FIGS. 2A and 2B are schematic views showing the structure of a multilayer PCB according to a second embodiment of the present invention. Note that the X-, Y-, and Z-axes as described above are also shown in FIGS. 2A and 2B. Specifically, FIG. 2A is a top view of the multilayer PCB, and FIG. 2B is a view showing a cross section of the multilayer PCB viewed from the direction of arrow B and taken along plane A shown in FIG. 2A (see one-dot chain line) which is parallel to the ZX-plane.

The multilayer PCB shown in FIGS. 2A and 2B differs from the multilayer PCB according to the first embodiment (see FIGS. 1A and 1B) in that a signal trace 301, two vias 302a and 302b, and a ground trace 303 are further provided. Since there is no other difference between the multilayer PCBs, elements shown in FIGS. 2A and 2B corresponding to those shown in FIGS. 1A and 1B are denoted by the same reference numerals, and the descriptions thereof are omitted herein.

Similar to the signal trace 103, the signal trace 301 is composed of a conductive material, and formed on the top face of the substrate 101 in a direction parallel to the Y-axis. Also, the signal trace 301 is located away from the signal trace 201 by a predetermined distance in the X-axis direction (in this instance, the negative direction of the X-axis). Here, if the signal trace 301 is projected vertically down onto the ground layer 102, the projected signal trace 301 crosses the gap portion α. The signal trace 301 is formed on the top face of the substrate 101 which satisfies the above positional condition. That is, similar to the signal trace 103, the signal trace 301 is situated so as to straddle the gap portion α.

Also, the vias 302a and 302b are similar to the above-described vias 104a and 104b, respectively, except for where they are formed. In the vias 302a and 302b, a through hole is formed in the vicinity of an edge of the ground layer 102 so as to be located away from the signal trace 301 by a predetermined distance in the X-axis direction (in this instance, the negative direction of the X-axis).

Also, the ground trace 303 is composed of a conductive material, and formed on the top face of the substrate 101 in a direction parallel to the Y-axis. The ground trace 303 connects the vias 302a and 302b at their top ends.

In the above structure, if a current is applied to both a load (not shown) connected to the signal trace 103, 201, or 301, or any combination of two or more of these signal traces, and a load (not shown) connected to the ground layer 102 (see arrows C1–C3 in FIG. 2A), part or all of a return current flows from the ground layer 102 through the via 104a to the ground trace 105 substantially without detouring around the gap portion α, as indicated by arrows D1 and D2 in FIG. 2A, and then the part or all of the return current returns to the ground layer 102 through the via 104b. As indicated by arrow D3 in FIG. 2A, the rest or all of the return current flows from the ground layer 102 through the via 302a to the ground trace 303, and then returns to the ground layer 102 through the via 302b. Thus, it is possible to reduce the current loop area when compared to the case where all the return current detours around the gap portion α. In this manner, the multilayer PCB according to the present embodiment curbs the occurrence of unwanted emission.

Moreover, in the multilayer PCB according to the present embodiment, two ground traces 105 and 303 are shared by three signal traces 103, 201, and 301, and therefore, it is possible to reduce the number of required ground traces when compared to the conventional art. As a result, it is possible to reduce the area that is occupied by various traces on the substrate 101 (i.e., the trace area). Thus, in the multilayer PCB according to the present embodiment, it is also possible to achieve technical effects similar to those achieved in the first embodiment.

Note that the ground trace 303 may be provided between the signal traces 201 and 301.

(Third Embodiment)

Figure 3A:
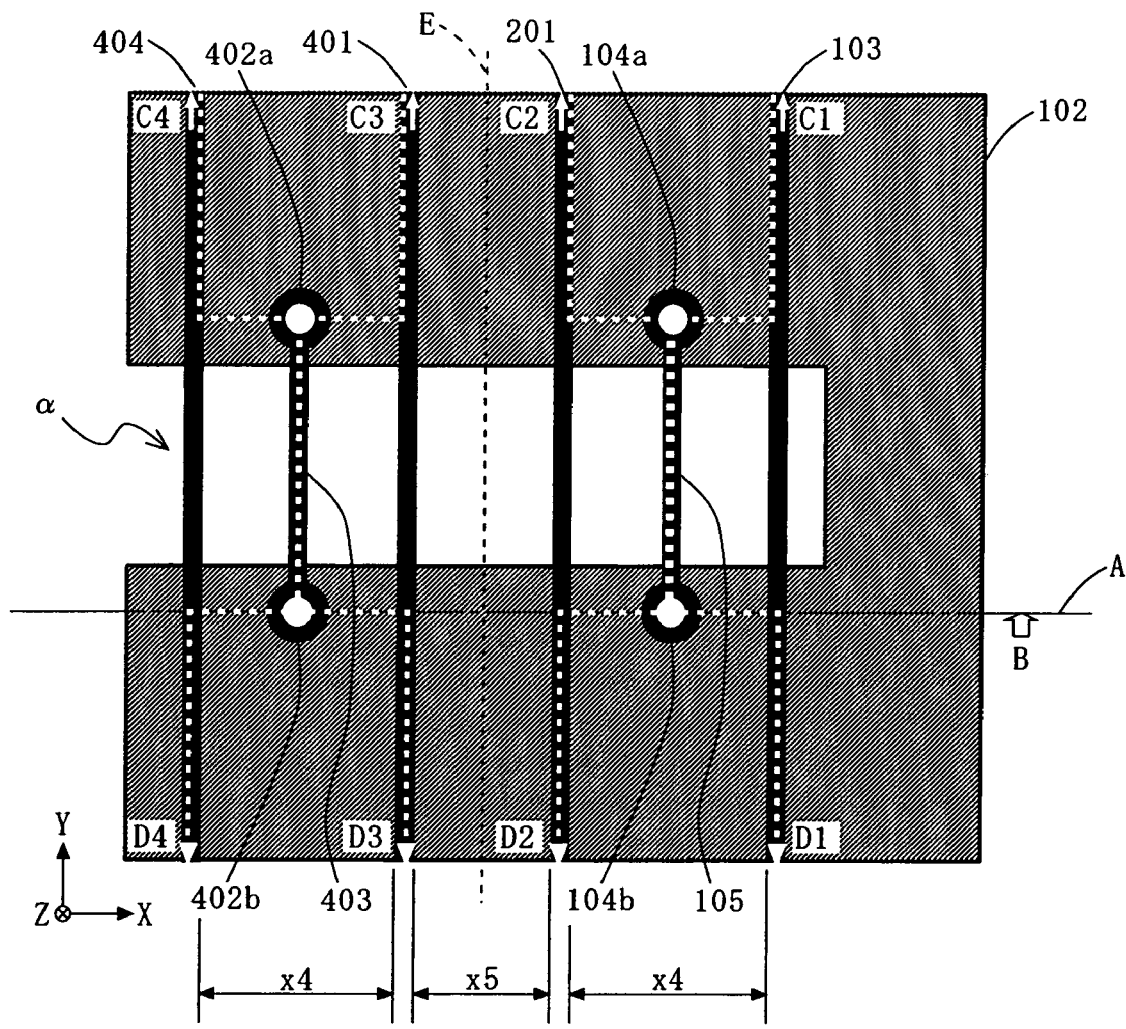
FIG. 3A is a top view showing a structure of a multilayer PCB according to a third embodiment of the present invention.
Figure 3B:
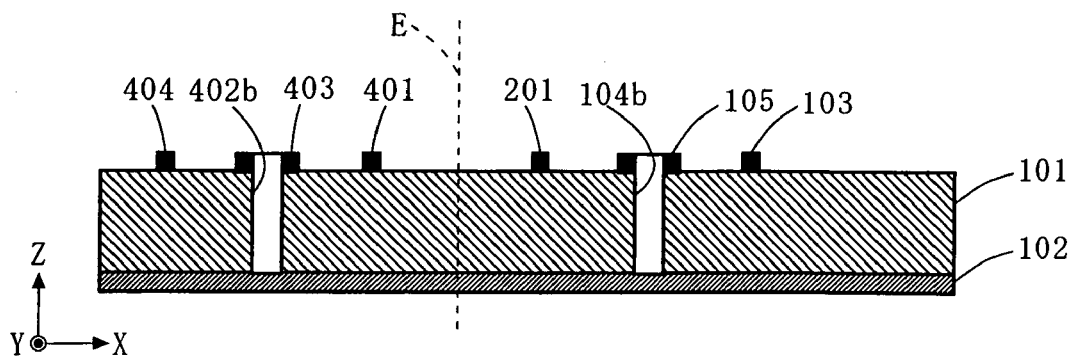
FIG. 3B is a cross-sectional view of the multilayer PCB taken along plane A shown in FIG. 3A.

FIGS. 3A and 3B are schematic views showing the structure of a multilayer PCB according to a third embodiment of the present invention. Note that the X-, Y-, and Z-axes as described above are also shown in FIGS. 3A and 3B. Specifically, FIG. 3A is a top view of the multilayer PCB, and FIG. 3B is a view showing a cross section of the multilayer PCB viewed from the direction of arrow B and taken along plane A shown in FIG. 3A (see one-dot chain line) which is parallel to the ZX-plane.

The multilayer PCB shown in FIGS. 3A and 3B differs from the multilayer PCB according to the first embodiment (see FIGS. 1A and 1B) in that signal traces 401 and 404, two vias 402a and 402b, and a ground trace 403 are further provided. Since there is no other difference between the multilayer PCBs, elements shown in FIGS. 3A and 3B corresponding to those shown in FIGS. 1A and 1B are denoted by the same reference numerals, and the descriptions thereof are omitted herein.

Similar to the signal trace 103, the signal trace 401 is composed of a conductive material, and formed on the top face of the substrate 101 in a direction parallel to the Y-axis. The signal trace 401 is located symmetrical to the signal trace 201 with respect to reference plane E which lies parallel to the YZ-plane at a predetermined distance of x5/2 from the left side of the signal trace 201 in the negative direction of the X-axis.

Also, the vias 402a and 402b are similar to the above-described vias 104a and 104b, respectively, except for where they are formed. The vias 402a and 402b are located symmetrical to the vias 104a and 104b, respectively, with respect to reference plane E.

Also, the ground trace 403 is composed of a conductive material, and formed on the top face of the substrate 101 in a direction parallel to the Y-axis. The ground trace 403 is located symmetrical to the ground trace 105 with respect to reference plane E. The ground trace 403 connects the vias 402a and 402b at their top ends.

Similar to the signal trace 103, the signal trace 404 is composed of a conductive material, and formed on the top face of the substrate 101 in a direction parallel to the Y-axis. The signal trace 404 is located symmetrical to the signal trace 103 with respect to reference plane E.

In the above structure, if a current is applied to both a load (not shown) connected to at least one signal trace (103, 201, 401, and 404) and a load (not shown) connected to the ground layer 102 (see any one of arrows C1–C4 in FIG. 3A), part or all of a return current flows from the ground layer 102 through a via (104a or 402a) to a ground trace (105 or 403) substantially without detouring around the gap portion α, as indicated by arrows D1–D4 in FIG. 3A, and then the part or all of the return current returns to the ground layer 102 through a via (104b or 403b). Thus, it is possible to reduce the current loop area when compared to the case where all the return current detours around the gap portion α. In this manner, the multilayer PCB according to the present embodiment curbs the occurrence of unwanted emission.

Moreover, in the multilayer PCB according to the present embodiment, a single ground trace (105 or 403) is shared by a set of two signal traces (i.e., a set of signal traces 103 and 201 or a set of signal traces 401 and 404), and therefore, it is possible to reduce the number of required ground traces when compared to the conventional art. As a result, it is possible to reduce the area that is occupied by various traces on the substrate 101 (i.e., the trace area). Thus, in the multilayer PCB according to the present embodiment, it is also possible to achieve technical effects similar to those achieved in the first embodiment.

Note that upon designing a circuit on a multilayer PCB, it is also necessary to take account of crosstalk between traces (typically, signal traces). A discussion about distances between traces is given below in relation to the crosstalk. Here, for convenience of explanation, it is assumed that the distance between the signal traces 103 and 201 and the distance between the signal traces 401 and 404 are each x4, and the distance between the signal traces 201 and 401 is x5.

First, from the viewpoint of reducing the trace area, as described in the first embodiment, it is preferred that distances x4 and x5 are reduced to as short as possible. Moreover, it is preferred that distance x5 is less than distance x4.

On the other hand, from the viewpoint of reducing the crosstalk, for example, it is preferred that the distance between the signal traces 103 and 201, the distance between the signal traces 201 and 401, and the distance between the signal traces 401 and 404 are each more than a predetermined value. For example, distances x4 and x5 are selected so as to be three times the width of a signal trace. In the multilayer PCB according to the present embodiment, the ground trace 105 is provided between the signal traces 103 and 201, and the ground trace 403 is provided between the signal traces 401 and 404. Thus, it is possible to reduce crosstalk interference between the signal traces 103 and 201, and also between the signal traces 401 and 404. Moreover, if a higher priority is given to reduction of crosstalk interference between the signal traces 201 and 401, it is preferred that distance x5 is equal to or more than distance x4.

(Fourth Embodiment)

Figure 4A:
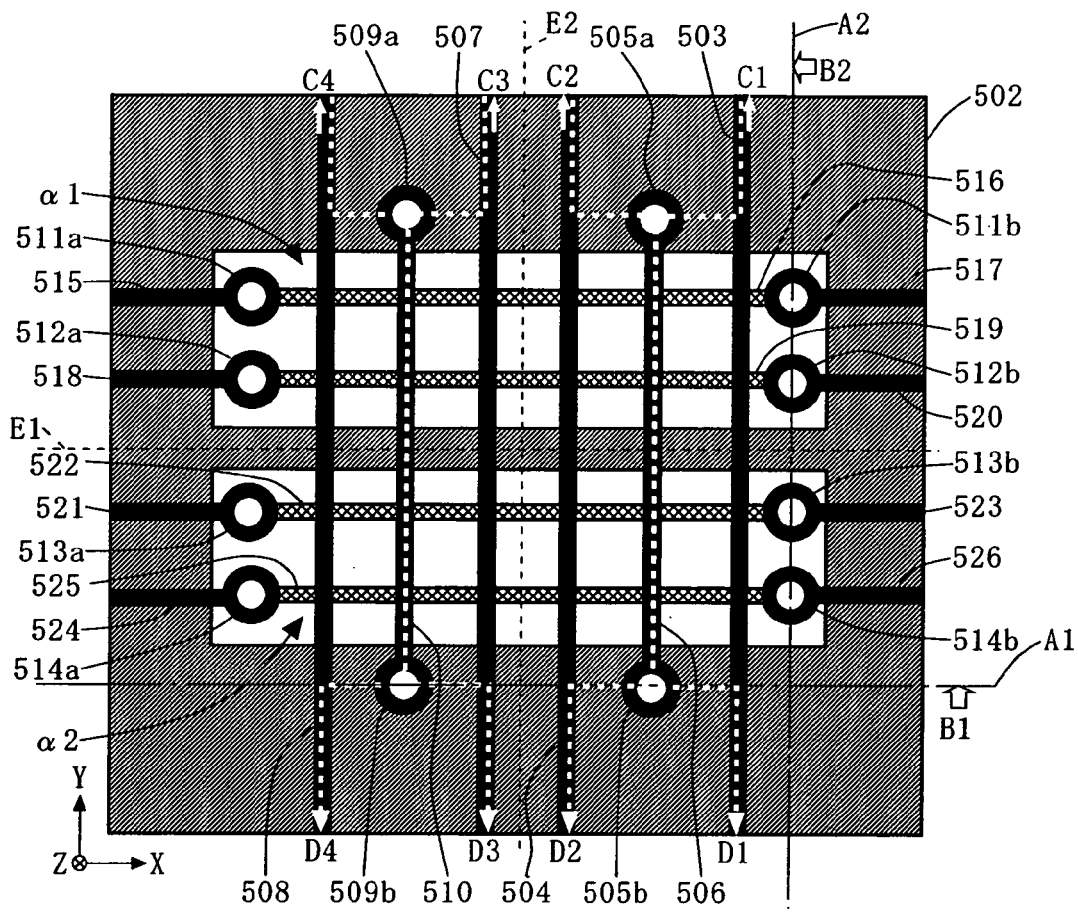
FIG. 4A is a top view showing a structure of a multilayer PCB according to a fourth embodiment of the present invention.
Figure 4B:
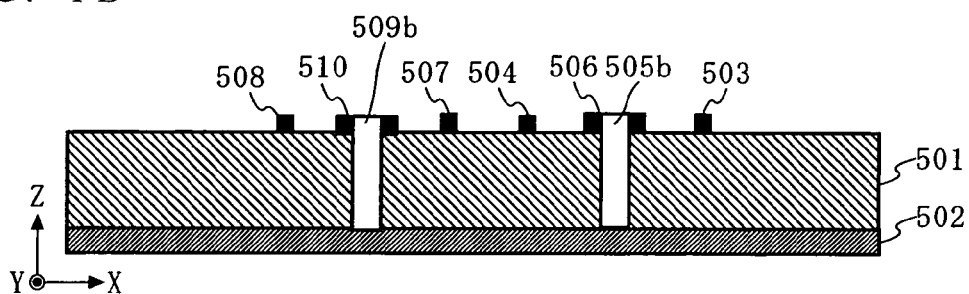
FIG. 4B is a cross-sectional view of the multilayer PCB taken along plane A1 shown in FIG. 4A.
Figure 4C:
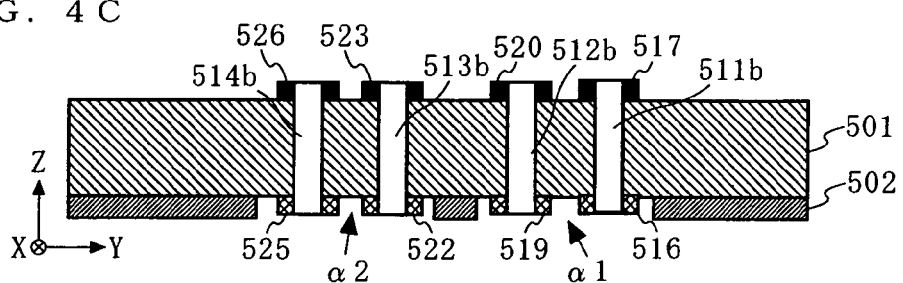
FIG. 4C is a cross-sectional view of the multilayer PCB taken along plane A2 shown in FIG. 4A.

FIGS. 4A–4C are schematic views showing the structure of a multilayer PCB according to a fourth embodiment of the present invention. Note that the X-, Y-, and Z-axes as described above are also shown in FIGS. 4A–4C. Specifically, FIG. 4A is a top view of the multilayer PCB; FIG. 4B is a view showing across section of the multilayer PCB viewed from the direction of arrow B1 and taken along plane A1 shown in FIG. 4A (see one-dot chain line) which is parallel to the ZX-plane; and FIG. 4C is a view showing a cross section of the multilayer PCB viewed from the direction of arrow B2 and taken along plane A2 shown in FIG. 4A (see one-dot chain line) which is parallel to the YZ-plane.

In FIGS. 4A–4C, the multilayer PCB includes: a substrate 501; a ground layer 502; two signal traces 503 and 504; two vias 505$a$ and 505$b$; a ground trace 506; two signal traces 507 and 508; two vias 509$a$ and 509$b$; and a ground trace 510. The multilayer PCB further includes: vias 511$a$ and 511B; vias 512$a$ and 512$b$; vias 513$a$ and 513$b$; vias 514$a$ and 514$b$; signal traces 515–517; signal traces 518–520; signal traces 521–523; and signal traces 524–526. Note that for convenience of illustration, the substrate 501 is not shown in FIG. 4A.

Similar to the substrate 101, the substrate 501 is composed of a dielectric material, and the top and bottom faces thereof are substantially parallel to the XY-plane.

The ground layer 502 is composed of a low impedance material, and formed on the bottom face of the substrate 501. The ground layer 502 is not formed across the entire bottom face of the substrate 501. In the present embodiment, as shown in FIG. 4A, the ground layer 502 has edges which define at least two gap portions $\alpha 1$ and $\alpha 2$ formed for reasons of the design of a print pattern and/or for convenience of mounting. Specifically, the gap portions $\alpha 1$ and $\alpha 2$ are each a substantially rectangular slit, and create, in the ground layer 501, spaces which are symmetrical to each other with respect to reference plane E1 parallel to the ZX-plane. Also, in the present embodiment, for convenience of explanation, it is assumed that the gap portions $\alpha 1$ and $\alpha 2$ each form a shape having plane symmetry with respect to reference plane E2 parallel to the YZ-plane.

The two signal traces 503 and 504 are each composed of a conductive material, and formed on the top face of the substrate 501 in a direction parallel to the Y-axis. Here, if each of the signal traces 503 and 504 is projected vertically down onto the ground layer 502, the projected signal traces 503 and 504 cross the gap portions $\alpha 1$ and $\alpha 2$. The two signal traces 503 and 504 are located at different distances from reference plane E2 in the positive direction of the X-axis. Here, the distance between the signal traces 503 and 504 is selected so as to be equal to the above distance x4 (see FIG. 3A).

Also, the two vias 505$a$ and 505$b$ are formed in a manner similar to the vias 104$a$ and 104$b$, but located in positions different from those of the vias 104$a$ and 104$b$. Specifically, the via 505$a$ is located in the vicinity of the midpoint between the signal traces 503 and 504 in the X-axis direction, and deviated by a predetermined distance from the gap portion $\alpha 1$ in the positive direction of the Y-axis. Also, the via 505$b$ is located symmetrical to the via 505$a$ with respect to reference plane E1.

Also, the ground trace 506 is composed of a conductive material, and formed on the top face of the substrate 501 in a direction parallel to the Y-axis. The ground trace 506 connects the vias 505$a$ and 505$b$ at their top ends.

The two signal traces 507 and 508, the two vias 509$a$ and 509$b$, and the ground trace 510 are located symmetrical to the two signal traces 503 and 504, the two vias 505$a$ and 505$b$, and the ground trace 506, respectively, with respect to reference plane E2.

Also, the vias 511$a$–514$a$ and 511$b$–514$b$ are obtained by applying a coating of conductive material to through holes located at different positions on the substrate 501 and having an axis parallel to the Z-axis.

The via 511$a$ is formed in such a position that if the via 511$a$ is projected vertically down onto the ground layer 502, the projection falls within an area of the gap portion $\alpha 1$. More preferably, the via 511$a$ is located as close to the ground layer 502 as possible. Also, the via 511$b$ is located symmetrical to the via 511$a$ with respect to reference plane E2.

Also, the via 512$a$ is formed in a position displaced parallel to and at a predetermined distance from the via 511$a$ in the negative direction of the Y-axis, such that if the via 512$a$ is projected vertically down onto the ground layer 502, the projection falls within an area of the gap portion $\alpha 1$. Also, the via 512$b$ is located symmetrical to the via 512$a$ with respect to reference plane E2.

Also, the vias 513$a$ and 513$b$ are located symmetrical to the vias 512$a$ and 512$b$, respectively, with respect to reference plane E1. Further, the vias 514$a$ and 514$b$ are located symmetrical to the vias 511$a$ and 511$b$, respectively, with respect to reference plane E1.

The signal trace 515 is composed of a conductive material, and formed on the top face of the substrate 501 so as to extend from the left end of the substrate 501 to the top end of the via 511$a$ in a direction parallel to the X-axis. The signal trace 516 is composed of a conductive material, and formed on the bottom face of the substrate 501 so as to extend from the bottom end of the via 511$a$ to the bottom end of the via 511$b$ in the direction parallel to the X-axis. The signal trace 517 is located symmetrical to the signal trace 515 with respect to reference plane E2.

The signal traces 518–520 are composed of a conductive material, and formed in positions displaced parallel to and at a predetermined distance from the signal traces 515–517, respectively, in the negative direction of the Y-axis. Here, the amount of displacement is equal to the distance between the axis of the via 511$a$ and the axis of the via 512$a$.

Also, the signal traces 521–523 are each composed of a conductive material. The signal traces 521–523 are located symmetrical to the signal traces 518–520, respectively, with respect to reference plane E1.

Also, the signal traces 524–526 are each composed of a conductive material. The signal traces 524–526 are located symmetrical to the signal traces 515–517, respectively, with respect to reference plane E1.

In the above structure, as in the third embodiment, if a current is applied only to the signal traces on the top face of the substrate 501, a return current flows through the ground traces substantially without detouring around the gap portions $\alpha 1$ and $\alpha 2$. Accordingly, as described in relation to the preceding embodiments, in the multilayer PCB according to the present embodiment, it is possible to curb the occurrence of unwanted emission. Also, a single ground trace is shared by two signal traces on the top face side, and therefore, in the multilayer PCB according to the present embodiment, technical effects similar to those described in the first embodiment can be achieved.

Also, if a current is applied to a signal path passing through the gap portion α1 or α2 (for example, a path consisting of the signal trace 515, the via 511a, the signal trace 516, the via 511b, and the signal trace 517), are turn current detours around the gap portion α1 or α2. However, the signal traces 516, 519, 522 and 525 are all placed in the gap portion α1 or α2, i.e., all of them are situated in the vicinity of the ground layer 502, and therefore, it is possible to reduce the current loop area. Thus, it is possible to reduce unwanted emission from the signal path passing through the gap portion α1 or α2. Further, it is possible to provide a number of signal paths in a limited space.

(Fifth Embodiment)

Figure 5A:
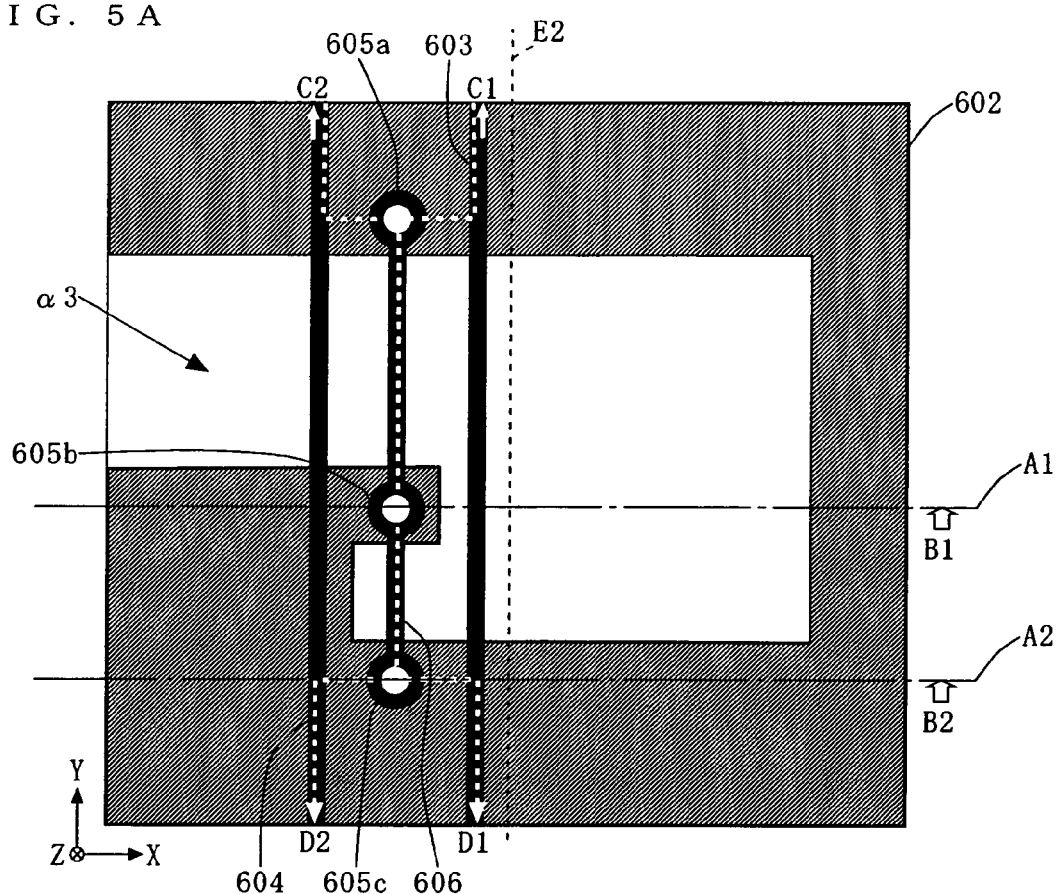
FIG. 5A is a top view showing a structure of a multilayer PCB according to a fifth embodiment of the present invention.
Figure 5B:
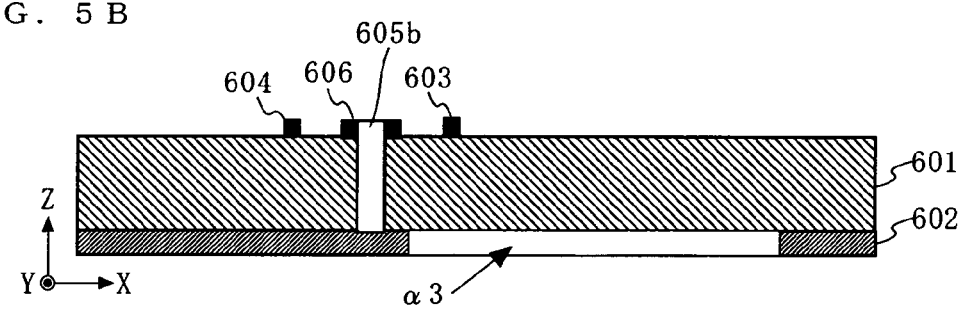
FIG. 5B is a cross-sectional view of the multilayer PCB taken along plane A1 shown in FIG. 5A.
Figure 5C:
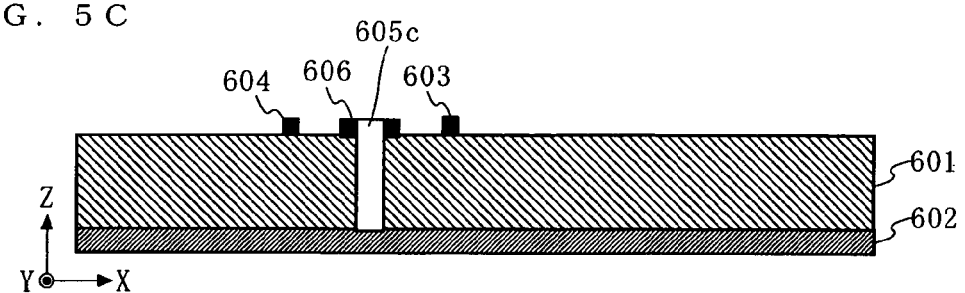
FIG. 5C is a cross-sectional view of the multilayer PCB taken along plane A2 shown in FIG. 5A.

FIGS. 5A–5C are schematic views showing the structure of a multilayer PCB according to a fifth embodiment of the present invention. Note that the X-, Y-, and Z-axes as described above are also shown in FIGS. 5A–5C. Specifically, FIG. 5A is a top view of the multilayer PCB; FIG. 5B is a view showing across section of the multilayer PCB viewed from the direction of arrow B1 and taken along plane A1 shown in FIG. 5A (see one-dot chain line) which is parallel to the ZX-plane; and FIG. 5C is a view showing a cross section of the multilayer PCB viewed from the direction of arrow B2 and taken along plane A2 (see one-dot chain line) which is situated in a position displaced parallel to and at a predetermined distance from plane A1 shown in FIG. 5A in the negative direction of the Y-axis.

In FIGS. 5A–5C, the multilayer PCB according to the present embodiment includes: a substrate 601; a ground layer 602; two signal traces 603 and 604; three vias 605a–605c; and a ground trace 606. Note that for convenience of illustration, the substrate 601 is not shown in FIG. 5A.

Similar to the above-described substrate 101, the substrate 601 is composed of a dielectric material, and the top and bottom faces thereof are substantially parallel to the XY-plane.

The ground layer 602 is composed of a low impedance material, and formed on the bottom face of the substrate 601. The ground layer 602 is not formed across the entire bottom face of the substrate 601. In the present embodiment, as shown in FIG. 5A, the ground layer 602 has edges which define a spiral-shaped gap portion α3 formed for reasons of the design of a print pattern and/or for convenience of mounting. Thus, the ground layer 602 has a protruded portion formed substantially in the center thereof.

Each of the two signal traces 603 and 604 is composed of a conductive material, and formed on the top face of the substrate 601 in a direction parallel to the Y-axis. Here, if the signal trace 603 is projected vertically down onto the ground layer 602, the projected signal trace 603 crosses a wide part of the gap portion α3. Also, if the signal trace 604 is projected vertically down onto the ground layer 602, the projected signal trace 604 crosses a narrow part of the gap portion α3. Also, the distance between the two signal traces 603 and 604 is set so as to be equal to the distance x4 as described above (see FIG. 3A).

Also, the three vias 605a–605c are formed in a manner similar to the via 104a, for example, but located in positions different from the position of the via 104a. Specifically, the via 605a is located in the vicinity of the midpoint between the signal traces 603 and 604 in the X-axis direction, and deviated by a predetermined distance from the gap portion α3 in the positive direction of the Y-axis.

Also, the via 605b is located away from the via 605a by a predetermined distance in the negative direction of the Y-axis. More specifically, the via 605b is formed in such a position that if the via 605b is projected vertically down onto the ground layer 602, the projection falls within an area of the protruded portion of the ground layer 602.

Also, the via 605c is located away from the via 605b by a predetermined distance in the negative direction of the Y-axis. More specifically, the via 605c is formed in such a position that if the via 605c is projected vertically down onto the ground layer 602, the projection falls with in an area other than the protruded portion of the ground layer 602.

Note that as in the preceding embodiments, it is preferred that the vias 605b and 605c are located as close to an edge of the ground layer 602 as possible.

Also, the ground trace 606 is composed of a conductive material, and formed on the top face of the substrate 601 in a direction parallel to the Y-axis. The ground trace 606 connects the vias 605a–605c at their top ends.

In the above structure, as is apparent from the preceding embodiments, if a current is applied to each or either of the signal traces 603 and 604, a return current flows through a ground trace substantially without detouring around the gap portion α3. Accordingly, also in the multilayer PCB according to the present embodiment, it is possible to curb the occurrence of unwanted emission. Also, a single ground trace is shared by the two signal traces 603 and 604, and therefore, it is possible to reduce the trace area. Thus, in the multilayer PCB according to the present embodiment, technical effects similar to those achieved in the first embodiment can be achieved.

Thus, by placing a plurality of vias 605 in proper positions in accordance with the shape of the gap portion α3, it is made possible to reduce the current loop area even if the ground layer 602 is designed in a complex shape. Thus, it is possible to increase the degree of freedom in designing a print pattern and/or in mounting.

While the invention has been described in detail, the foregoing description is in all aspects illustrative and not restrictive. It is understood that numerous other modifications and variations can be devised without departing from the scope of the invention.

What is claimed is:

1. A multilayer printed circuit board comprising:
   a substrate;
   a ground layer having edges which define a gap portion, the ground layer being provided on a bottom face of the substrate;
   a first signal trace and a second signal trace provided on a top face of the substrate so as to straddle the gap portion and so as to be substantially parallel to each other; and
   a first ground trace provided between the first and second signal traces on the top face of the substrate so as to straddle the gap portion.

2. The multilayer printed circuit board according to claim 1, further comprising a plurality of vias formed in the substrate so as to connect each of two ends of the first ground trace to the ground layer.

3. The multilayer printed circuit board according to claim 1, further comprising:
   a third signal trace provided on the top face of the substrate so as to straddle the gap portion, the third signal trace being substantially parallel to one of the first and second signal traces at a predetermined distance therefrom on a side of the one of the first and second signal traces away from the first ground trace; and a second ground trace provided on the top face of the substrate so as to straddle the gap portion, the second ground trace being substantially parallel to the third signal trace at a predetermined distance therefrom on a side of the third signal trace away from the first ground trace.

4. The multilayer printed circuit board according to claim 3, further comprising a plurality of vias formed in the substrate so as to connect each of two ends of the second ground trace to the ground layer.

5. The multilayer printed circuit board according to claim 3, further comprising a fourth signal trace provided on the top face of the substrate so as to straddle the gap portion, the fourth signal trace being substantially parallel to the third signal trace at a predetermined distance from the second ground trace on a side of the second ground trace away from the third signal trace.

6. The multilayer printed circuit board according to claim 1, further comprising:
   a fifth signal trace formed within the gap portion on the bottom face of the substrate; and
   a plurality of sixth signal traces formed on the top face of the substrate, the sixth signal traces being electrically connected to the fifth signal trace.

7. The multilayer printed circuit board according to claim 6, further comprising: a plurality of vias formed in the substrate so as to connect each of two ends of the fifth signal trace to any one end of each of the plurality of sixth signal traces.

8. The multilayer printed circuit board according to claim 2, wherein
   the gap includes a first gap part of a first width and a second gap part of a second width, the first and second widths being different,
   the first signal trace straddles the first gap part and the second signal trace straddles the second gap part,
   the first ground trace straddles the gap portion more than once, and
   a number of the plurality of vias is equal to a value obtained by adding 1 to a number of times the first ground trace straddles the gap portion.

9. The multilayer printed circuit board according to claim 1, wherein the gap portion is a cut or a slit.

10. The multilayer printed circuit board according to claim 1, which is applied to a digital circuit.

11. The multilayer printed circuit board according to claim 1, wherein if a current is applied to a load connected to the first or second signal trace and a load connected to the ground layer, part or all of a return current flows from the ground layer to the first ground trace, which is provided on the top face of the substrate, substantially without detouring around the gap portion, and returns to the ground layer.

* * * * *